(12) United States Patent
Dai et al.

(10) Patent No.: US 10,872,989 B2
(45) Date of Patent: *Dec. 22, 2020

(54) ENCAPSULANT MATERIAL FOR PHOTOVOLTAIC MODULES AND METHOD OF PREPARING THE SAME

(71) Applicants: TIGER NEW SURFACE MATERIALS (SUZHOU) CO., LTD., Suzhou (CN); SUNMAN (SHANGHAI) CO., LTD., Shanghai (CN)

(72) Inventors: Tianhe Dai, Suzhou (CN); Biao Luo, Suzhou (CN); Zhicheng Wang, Suzhou (CN); Guozhu Long, Shanghai (CN); Jiaoyan Liu, Shanghai (CN); Chengrong Lian, Shanghai (CN); Weili Wang, Shanghai (CN)

(73) Assignees: TIGER NEW SURFACE MATERIALS (SUZHOU) CO., LTD., Suzhou (CN); SUNMAN (SHANGHAI) CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,722

(22) Filed: Aug. 22, 2018

(65) Prior Publication Data

US 2018/0374974 A1 Dec. 27, 2018

Related U.S. Application Data

(63) Continuation-in-part of application No. PCT/CN2017/072149, filed on Jan. 23, 2017.

(30) Foreign Application Priority Data

Aug. 18, 2016 (CN) .......................... 2016 1 0685536

(51) Int. Cl.
*H01L 31/048* (2014.01)
*H01L 31/18* (2006.01)
(Continued)

(52) U.S. Cl.
CPC ......... *H01L 31/0481* (2013.01); *D06N 3/042* (2013.01); *H01L 31/048* (2013.01);
(Continued)

(58) Field of Classification Search
None
See application file for complete search history.

(56) References Cited

U.S. PATENT DOCUMENTS

2003/0085383 A1* 5/2003 Burnell-Jones ......... C08L 67/06
252/301.36
2003/0100678 A1* 5/2003 Nicholl ................ C09D 133/06
525/166
(Continued)

FOREIGN PATENT DOCUMENTS

CN 1604847 A 4/2005
CN 102315285 A 1/2012
(Continued)

OTHER PUBLICATIONS

Technical Information Sheet—Tiger Drylac® powder coating; (Year: 2019).*

*Primary Examiner* — Tamir Ayad
(74) *Attorney, Agent, or Firm* — Matthias Scholl P.O.; Matthias Scholl

(57) ABSTRACT

An encapsulant material for a photovoltaic module. The encapsulant material includes: between 30 and 50 parts by weight of fiber cloth and between 50 and 70 parts by weight of acrylic powder coating. The fiber cloth is made of fiber material. The acrylic powder coating includes an acrylic resin, a curing agent, and an additive. The acrylic powder (Continued)

coating is uniformly coated on the fiber cloth. A method of preparing the encapsulant material includes: uniformly coating the acrylic powder coating on the fiber cloth, thermally bonding the acrylic powder coating and the fiber cloth using pressure and heat, and piecewise cutting the thermally bonded acrylic powder coating and the fiber cloth.

7 Claims, 3 Drawing Sheets

(51) Int. Cl.
*D06N 3/04* (2006.01)
*D06N 3/00* (2006.01)
*D06M 15/263* (2006.01)

(52) U.S. Cl.
CPC .......... *H01L 31/18* (2013.01); *H01L 31/1876* (2013.01); *D06M 15/263* (2013.01); *D06N 3/0022* (2013.01); *D06N 3/0093* (2013.01); *D06N 2201/082* (2013.01); *D06N 2201/087* (2013.01); *Y02B 10/10* (2013.01); *Y02E 10/50* (2013.01); *Y02P 70/50* (2015.11)

(56) References Cited

U.S. PATENT DOCUMENTS

| | | | | |
|---|---|---|---|---|
| 2014/0209171 | A1* | 7/2014 | Ehbing | C08L 75/16 |
| | | | | 136/259 |
| 2015/0144194 | A1* | 5/2015 | Kajisa | H01L 31/0481 |
| | | | | 136/259 |
| 2016/0254404 | A1* | 9/2016 | Dries | H01L 31/048 |
| | | | | 136/251 |

FOREIGN PATENT DOCUMENTS

| | | |
|---|---|---|
| CN | 102364694 A | 2/2012 |
| CN | 102456758 A | 5/2012 |
| CN | 103059676 A | 4/2013 |
| CN | 105637653 A | 6/2016 |
| CN | 106299000 A | 1/2017 |
| EP | 0769818 A2 | 4/1997 |
| EP | 0836233 A2 | 4/1998 |
| EP | 2623314 A1 | 8/2013 |
| EP | 2863443 A1 | 4/2015 |
| KR | 20160027694 A | 3/2016 |
| WO | 2014/075058 A1 | 5/2014 |

* cited by examiner ed photovoltaic modules cannot meet the technical requirements of the photovoltaic industry in terms of impact resistance, fire resistance, and other properties.

ENCAPSULANT MATERIAL FOR PHOTOVOLTAIC MODULES AND METHOD OF PREPARING THE SAME

CROSS-REFERENCE TO RELATED APPLICATIONS

This application is a continuation-in-part of International Patent Application No. PCT/CN2017/072149 with an international filing date of Jan. 23, 2017, designating the United States, now pending, and further claims foreign priority benefits to Chinese Patent Application No. 201610685536.0 filed Aug. 18, 2016. The contents of all of the aforementioned applications, including any intervening amendments thereto, are incorporated herein by reference.

BACKGROUND

This disclosure relates to the photovoltaic field, and more particularly, to an encapsulant material for photovoltaic (PV) modules and a method of preparing the same.

Conventional photovoltaic modules used in the photovoltaic field are bulky. As shown in FIG. 5, an encapsulant structure of conventional photovoltaic modules includes, from top to bottom, a tempered glass layer 30c, an upper ethylene-vinyl acetate (EVA) layer 21c, a photovoltaic cell layer 10c, a lower EVA layer 22c, and a backsheet layer 40c. The density of the tempered glass layer reaches 2.5 g/cm$^3$, and the normal thickness of the tempered glass layer is 3.2 mm. Therefore, the tempered glass weights up to 8 kg per square meter, and the photovoltaic modules packaged by the encapsulant structure are bulky and difficult to install.

Currently, highly transparent films and/or transparent backsheets are used to replace the tempered glass to reduce the weight of the photovoltaic modules. However, because most of the highly transparent films and transparent backsheets are made of adhesive films such as ethylene-vinyl acetate (EVA) copolymer and poly(octene-ethylene) (POE), the encapsulated photovoltaic modules cannot meet the technical requirements of the photovoltaic industry in terms of impact resistance, fire resistance, and other properties.

SUMMARY

Disclosed is an encapsulant material for photovoltaic module that is inexpensive, light-weighted, can meet the technical standards of the photovoltaic industry such as UV resistance, anti-aging, impact resistance, fire prevention and the like.

Also disclosed is a method of preparing an encapsulant material for a photovoltaic module.

Disclosed is an encapsulant material for a photovoltaic module, the encapsulant material comprising:
  between 30 and 50 parts by weight of fiber cloth, the fiber cloth being woven fiber material; and
  between 50 and 70 parts by weight of acrylic powder coating, the acrylic powder coating comprising an acrylic resin, a curing agent and an additive, and the acrylic powder coating being uniformly coated on the fiber cloth.

The weight per unit area of the fiber cloth can be 30-400 g/m$^2$, and the weight per unit area of the acrylic powder coating on the fiber cloth can be 100-400 g/m$^2$.

The fiber material can be glass fiber, carbon fiber, aramid fiber, or a mixture thereof.

The monofilament diameter of the fiber material can be between 3 and 23 μm.

The fiber cloth can be made of fiber material in the form of plain weave, twill weave, satin weave, rib weave, mat weave, or a combination thereof.

The acrylic resin can have a refractive index of between 1.40 and 1.50, an epoxy equivalent of between 300 and 800 g/eq. (gram equivalent), a hydroxyl value of between 15 and 70 mg KOH/g, an acid value of between 15 and 85 mg KOH/g, a glass transition temperature of between 40 and 70° C., a viscosity of between 75 and 600 Pa·s, and a softening point of between 100 and 120° C.

The curing agent can account for 5-25 wt. % of the acrylic powder coating, and the curing agent is blocked isocyanate, phthalic anhydride, trimellitic anhydride, sebacic acid, undecandioic acid, dodecanedioic acid, tridecanedioic acid, tetradecandioic acid, pentadecandioic acid, hexadecandioic acid, carboxyl polyester, hydrogenated epoxy, glycidyl methacrylate-type (GMA-type) acrylic acid, or a mixture thereof.

The additive can account for 0-50 wt. % of the acrylic powder coating, and the additive is polyamide wax, polyolefine wax, amide modified phenolic urea surfactant, benzoin, poly(dimethylsiloxane), vinyl trichlorosilane, n-butyl triethoxyl silane, tetramethoxysilane (TMOS), monoalkoxy pyrophosphate, acrylics, phenolic resin, urea-formaldehyde resin, melamine formaldehyde resin, distearoyl ethylenediamine, a mixture of ethylene oxide and propylene oxide, hindered phenol, thiodipropionate, diphenyl ketone, salicylate derivatives, hindered amine, alumina, fumed silica, silica, or a mixture thereof.

Further disclosed is a method of preparing an encapsulant material for a photovoltaic module, the method comprising:
  1) uniformly coating the acrylic powder coating on the fiber cloth;
  2) thermally bonding the acrylic powder coating and the fiber cloth using pressure and heat; and
  3) cutting the thermally bonded acrylic powder coating and the fiber cloth obtained in 2) into the encapsulant material.

During the thermal bonding, the pressure is between 0.05 and 0.25 megapascal, the temperature is between 90 and 130° C., and the heating time is between 5 and 20 seconds.

The encapsulant material for a photovoltaic module of the disclosure comprises between 30 and 50 parts by weight of fiber cloth and between 50 and 70 parts by weight of acrylic powder coating which is uniformly coated on the fiber cloth. The encapsulant material meets the technical standards of the photovoltaic industry such as UV resistance, anti-aging, impact resistance, fire prevention and the like, and is inexpensive, light-weighted, can replace the tempered glass of conventional encapsulant structure, and provide rigidity for the photovoltaic module to protect the photovoltaic cells. Thus, the weight of the photovoltaic module is greatly reduced, which facilitates the installation of the photovoltaic module in different occasions, reduces the labor intensity for installing the photovoltaic module, improves the convenience of installation, and reduces the installation cost of the photovoltaic module.

The preparation method of the encapsulant material comprises uniformly coating the acrylic powder coating on the fiber cloth, thermally bonding the acrylic powder coating and the fiber cloth using pressure and heat, and then piecewise cutting the thermally bonded acrylic powder coating and the fiber cloth, to yield the encapsulant material. The dimensions of the PV module can be changed arbitrarily to meet the installation requirements of different buildings, which further facilitates the installation and application of the PV module.

DETAILED DESCRIPTION

Figure 1:
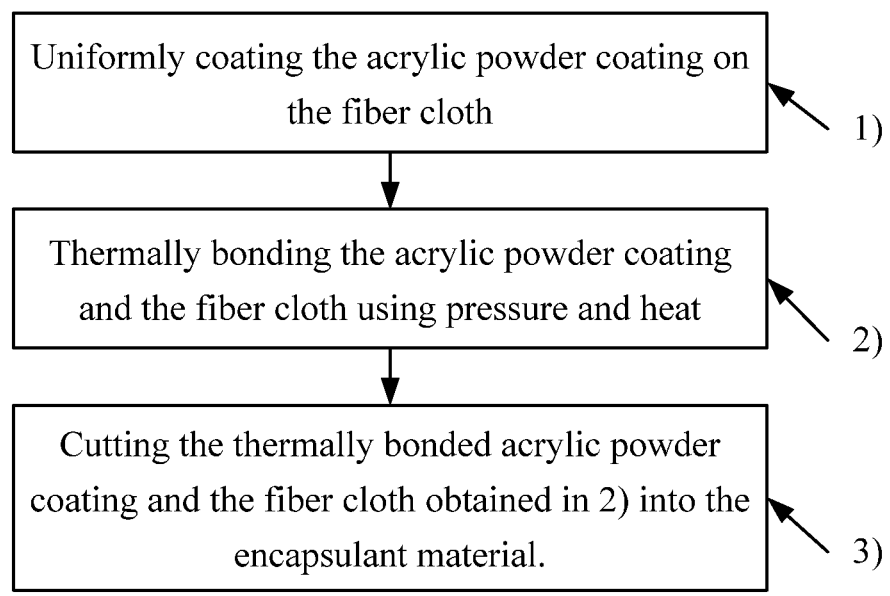
FIG. 1 is a flow chart of a method of preparing an encapsulant material for a photovoltaic module in the disclosure.

To further illustrate, experiments detailing an encapsulant material for a photovoltaic module and a method of preparing the same are described below. It should be noted that the following examples are intended to describe and not to limit the description.

The disclosure provides an encapsulant material for a photovoltaic module, the encapsulant material comprising: between 30 and 50 parts by weight of fiber cloth, the fiber cloth being made of fiber material; and between 50 and 70 parts by weight of acrylic powder coating, the acrylic powder coating comprising an acrylic resin, a curing agent and an additive, and the acrylic powder coating being uniformly coated on the fiber cloth.

The encapsulant material for a photovoltaic module of the disclosure comprises between 30 and 50 parts by weight of fiber cloth and between 50 and 70 parts by weight of acrylic powder coating which is uniformly coated on the fiber cloth. The encapsulant material meets the technical standards of the photovoltaic industry such as UV resistance, anti-aging, impact resistance, fire prevention and the like, and is inexpensive, light-weighted, can replace the tempered glass of conventional encapsulant structure, and provide rigidity for the photovoltaic module to protect the photovoltaic cells. Thus, the weight of the photovoltaic module is greatly reduced, which facilitates the installation of the photovoltaic module in different occasions, reduces the labor intensity for installing the photovoltaic module, improves the convenience of installation, and reduces the installation cost of the photovoltaic module.

The disclosure also provides a method of preparing an encapsulant material for a photovoltaic module, the method comprising:

1) uniformly coating the acrylic powder coating on the fiber cloth;
2) thermally bonding the acrylic powder coating and the fiber cloth using pressure and heat;
3) cutting the thermally bonded acrylic powder coating and the fiber cloth obtained in 2) into the encapsulant material.

The preparation method of the encapsulant material comprises uniformly coating the acrylic powder coating on the fiber cloth, thermally bonding the acrylic powder coating and the fiber cloth using pressure and heat, and then piecewise cutting the thermally bonded acrylic powder coating and the fiber cloth, to yield the encapsulant material. The dimensions of the PV module can be changed arbitrarily to meet the installation requirements of different buildings, which further facilitates the installation and application of the PV module.

To more clearly explain the embodiments of the disclosure or the technical solutions in the prior art, the drawings used in the description of the embodiments or the prior art will be briefly described below. Obviously, the drawings in the following description are only some embodiments described in the disclosure, for those of ordinary skill in the art, other drawings may be obtained based on these drawings without any creative work.

Example 1

An encapsulant material for a photovoltaic module, the encapsulant material comprises: between 30 and 50 parts by weight of fiber cloth, the fiber cloth being made of fiber material. Preferably, the fiber cloth can be made of fiber material in the form of plain weave, twill weave, satin weave, rib weave, mat weave, or a combination thereof. Specifically, in this example, 30 parts by weight of fiber cloth are employed, and the fiber cloth is made of fiber material in the form of plain weave. Optionally, one of ordinary skilled in the art can select other weaving methods according to actual needs.

Preferably, in this example, the weight per unit area of the fiber cloth can be 30-400 g/m$^2$, which can ensure the lightweight and the strength of the fiber cloth. Specifically, in this example, the weight per unit area of the fiber cloth can be 100 g/m$^2$.

Preferably, in this example, the fiber material can be glass fiber, carbon fiber, aramid fiber, or a mixture thereof, to ensure that the fiber cloth has good insulation and weather resistance. Specifically, in this example, the fiber material is glass fiber. Optionally, one of ordinary skilled in the art can select other types of fiber materials according to actual needs, and the embodiments of the disclosure will not describe this one by one.

Preferably, the monofilament diameter of the fiber material is between 3 and 23 μm. Specifically, in this example, the monofilament diameter of the fiber material is 3 μm. This facilitates the weaving of the fiber material and is conducive to preparation of the fiber cloth having the desired weight per unit area.

The encapsulant material further comprises between 50 and 70 parts by weight of acrylic powder coating. The acrylic powder coating comprises an acrylic resin, a curing agent and an additive. Specifically, in this example, 70 parts by weight of acrylic powder coating are employed.

Preferably, in this example, the acrylic resin can have a refractive index of between 1.40 and 1.50, an epoxy equivalent of between 300 and 800 g/eq. (gram equivalent), a hydroxyl value of between 15 and 70 mg KOH/g, an acid value of between 15 and 85 mg KOH/g, a glass transition temperature of between 40 and 70° C., a viscosity of between 75 and 600 Pa·s, and a softening point of between 100 and 120° C. This can ensure the acrylic resin has good insulation and weather resistance. Preferably, the acrylic resin is hydroxy acrylic resin, glycidyl methacrylate-type (GMA-type) acrylic resin, carboxyl acrylic resin, bifunctional acrylic resin, or a mixture thereof. Specifically, in this example, the acrylic resin is GMA-type acrylic resin. Optionally, one of ordinary skilled in the art can select other types of acrylic resin according to actual needs, and the embodiments of the disclosure will not describe this one by one.

Preferably, in this example, the curing agent can account for 5-25 wt. % of the acrylic powder coating, and the curing agent is blocked isocyanate, phthalic anhydride, trimellitic anhydride, sebacic acid, undecandioic acid, dodecanedioic acid, tridecanedioic acid, tetradecandioic acid, pentadecandioic acid, hexadecandioic acid, carboxyl polyester, hydrogenated epoxy, glycidyl methacrylate-type (GMA-type) acrylic acid, or a mixture thereof. Specifically, in this example, the curing agent is blocked isocyanate which accounts for 10 wt. % of the acrylic powder coating. Optionally, one of ordinary skilled in the art can select other types of curing agent accounting for 5-25 wt. % (the end values 5% and 25% are practicable) of the acrylic powder coating according to actual needs, and the same technical effect can be achieved. The embodiments of the disclosure will not describe this one by one.

The acrylic powder coating is uniformly coated on the fiber cloth, and the weight per unit area of the acrylic powder coating can be 100-400 $g/m^2$. Specifically, in this example, the weight per unit area of the acrylic powder coating on the fiber cloth is 100 $g/m^2$.

In certain examples, the acrylic powder coating further comprises an additive. Preferably, the additive can account for 0-50 wt. % of the acrylic powder coating, which is conducive to improving the transparency, weather resistance, insulation and flame retardance of the acrylic powder coating. In addition, according to the actual installation requirements of the photovoltaic modules, the color of the acrylic powder coating can be adjusted by adding the additive, which further benefits the practical installation and application of the photovoltaic module. Specifically, the additive is polyamide wax, polyolefine wax, amide modified phenolic urea surfactant, benzoin, poly(dimethylsiloxane), vinyl trichlorosilane, n-butyl triethoxyl silane, tetramethoxysilane (TMOS), monoalkoxy pyrophosphate, acrylics, phenolic resin, urea-formaldehyde resin, melamine formaldehyde resin, distearoyl ethylenediamine, a mixture of ethylene oxide and propylene oxide, hindered phenol, thiodipropionate, diphenyl ketone, salicylate derivatives, hindered amine, alumina, fumed silica, silica, or a mixture thereof. Optionally, one of ordinary skilled in the art can select other types of additives according to actual needs, and the embodiments of the disclosure will not describe this one by one.

The acrylic powder coating of the disclosure can be prepared using any of the known preparation techniques for powder coatings. Typical methods include premixing, melt extrusion, and milling. Specifically, in this example, the acrylic resin is premixed with the curing agent, preferably, the premixing time is between 2 and 10 min (when the acrylic powder coating comprises an additive, the additive can be premixed together). Thereafter, the premixed mixture is extruded and pressed into thin slices with a screw extruder. The aspect ratio of the extruder can be set at between 15:1 and 50:1. The screw extruder is heated to between 80 and 120° C., and rotates at 200-800 rpm. The thin slices are crushed into small pieces which are conveyed to a powder mill to be ground into a powder coating having certain particle sizes. Preferably, the rotational speed of the powder mill is 50-150 rpm. The particle size of the acrylic powder coating is 35-300 μm. Optionally, the acrylic powder coating can be prepared using other process parameters or preparation processes; these parameters or preparation processes are familiar to one of ordinary skill in the art, so the embodiments of the disclosure will not describe this in detail.

As shown in FIG. 1, a method of preparing an encapsulant material for a photovoltaic module comprises:

1) uniformly coating the acrylic powder coating on the fiber cloth;

2) thermally bonding the acrylic powder coating and the fiber cloth using pressure and heat; and 3) cutting the thermally bonded acrylic powder coating and the fiber cloth obtained in 2) into the encapsulant material.

In this example, thermally bonding the acrylic powder coating and the fiber cloth is achieved under appropriate pressure and heat. It is only under appropriate pressure and temperature that a thermal bonding can be achieved between the acrylic powder coating and the fiber cloth, thus fulfilling the laminating requirement in the process of preparing the photovoltaic module, so as to prepare the encapsulant materials that can effectively apply to the encapsulant of the photovoltaic cell components. Preferably, during the thermal bonding, the pressure is between 0.05 and 0.25 megapascal, the temperature is between 90 and 130° C., and the heating time is between 5 and 20 seconds. Specifically, the pressure is 0.05 megapascal, the temperature is 130° C., and the heating time is 5 seconds.

Figure 2:
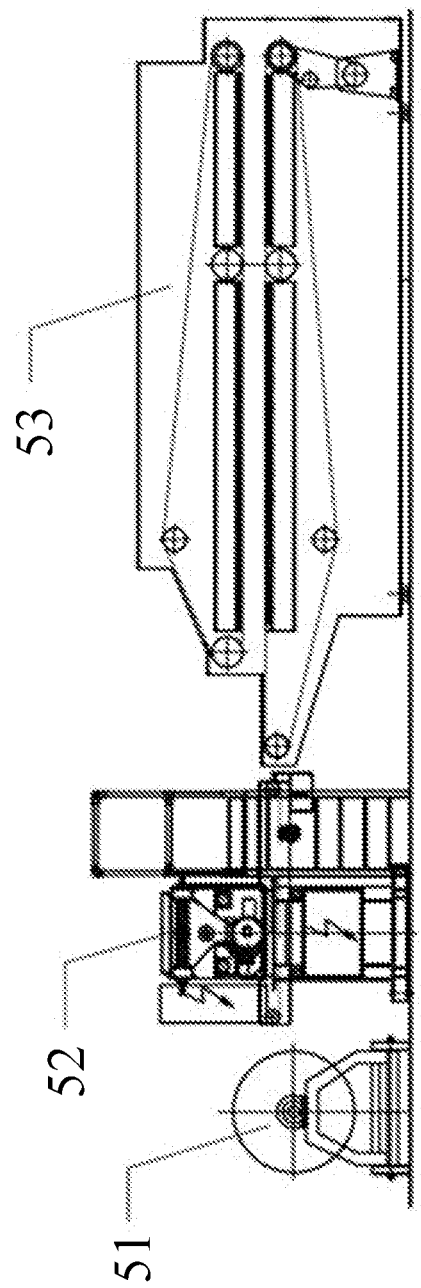
FIG. 2 is schematic diagram of a device for preparing an encapsulant material for a photovoltaic module in the disclosure.

Preferably, FIG. 2 illustrates a device for preparing the encapsulant material for a photovoltaic module. In the production process, the fiber cloth is put into a fiber feeder 51, and then the acrylic powder coating is uniformly coated on the fiber cloth output from the fiber feeder 51 by a coating device 52. Thereafter, the acrylic powder coating and the fiber cloth are thermally bonded under the pressure and heat produced by a hot-melt compound machine 53. The thermally bonded acrylic powder coating and the fiber cloth is piecewise cut, to yield an encapsulant material for a photovoltaic module. In other embodiments of the disclosure, the coating device can be a dusting head. The coating device implements the coating process in the form of powder dusting, and the acrylic powder coating is uniformly coated on the fiber cloth. Optionally, one of ordinary skill in the art can select other known devices to prepare the encapsulant material for photovoltaic modules.

Figure 3:
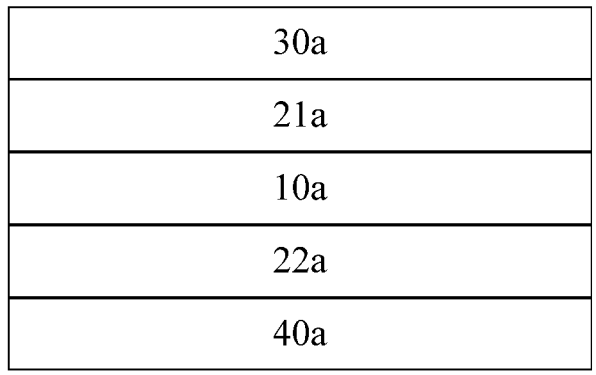
FIG. 3 is a schematic diagram of an encapsulant structure of a photovoltaic module using the encapsulant material in the disclosure.
Figure 4:
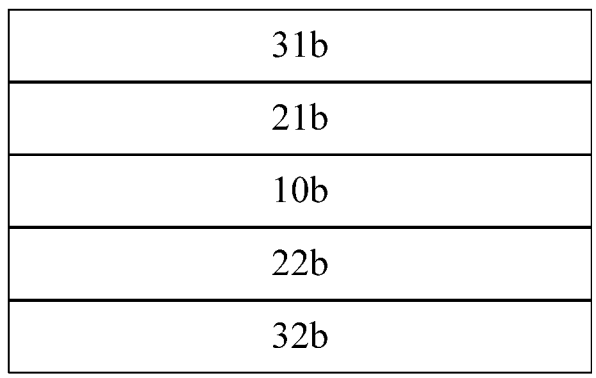
FIG. 4 is another schematic diagram of an encapsulant structure of a photovoltaic module using the encapsulant material in the disclosure.

FIG. 3 illustrates an encapsulant structure of a photovoltaic module using the encapsulant material. The photovoltaic encapsulant structure comprises, from top to bottom, an encapsulant material layer 30a, an upper EVA layer 21a, a photovoltaic cell layer 10a, a lower EVA layer 22a, and a backsheet layer 40a. The encapsulant material layer 30a substitutes for conventional tempered glass layer. One of ordinary skill in the art may use the encapsulant material of the embodiment of the disclosure to replace other encapsulant structures or to replace other layer structures in combination with other materials according to the actual needs and the conditions of the installation site, and the disclosure does not make specific restrictions on this. FIG. 4 illustrates another encapsulant structure of a photovoltaic module using the encapsulant material. The photovoltaic encapsulant structure comprises, from top to bottom, an upper encapsulant material layer 31b, an upper EVA layer 21b, a photovoltaic cell layer 10b, a lower EVA layer 22b, and a lower encapsulant material layer 32b. The upper encapsulant material layer 31b and the lower encapsulant material layer 32b substitutes for conventional tempered glass layer and backsheet layer, respectively.

Example 2

In this example, the encapsulant structure of a photovoltaic module comprises the following components:

35 parts by weight of fiber cloth; the fiber cloth is made of fiber material in the form of twill weave;
the weight per unit area of the fiber cloth is 30 g/m$^2$;
the fiber material is carbon fiber;
the monofilament diameter of the fiber material is 5 μm;
65 parts by weight of acrylic powder coating; the acrylic powder coating comprising an acrylic resin, a curing agent and an additive;
the acrylic resin is hydroxy acrylic resin;
the curing agent is phthalic anhydride, which accounts for 15 wt. % of the acrylic powder coating;
the additive is polyamide wax, which accounts for 10 wt. % of the acrylic powder coating;
the weight per unit area of the acrylic powder coating on the fiber cloth is 150 g/m$^2$;
during the thermal bonding for preparing the encapsulant material, the pressure is 0.1 megapascal, the temperature is 120° C., and the heating time is 8 seconds;
other technical solutions in Example 2 are the same as that in Example 1.

Example 3

In this example, the encapsulant structure of a photovoltaic module comprises the following components:
40 parts by weight of fiber cloth; the fiber cloth is made of fiber material in the form of satin weave;
the weight per unit area of the fiber cloth is 50 g/m$^2$;
the fiber material is aramid fiber;
the monofilament diameter of the fiber material is 8 μm;
60 parts by weight of acrylic powder coating; the acrylic powder coating comprising an acrylic resin, a curing agent and an additive;
the acrylic resin is bifunctional acrylic resin;
the curing agent is trimellitic anhydride, which accounts for 18 wt. % of the acrylic powder coating;
the additive is polyamide wax, which accounts for 15 wt. % of the acrylic powder coating;
the weight per unit area of the acrylic powder coating on the fiber cloth is 200 g/m$^2$;
during the thermal bonding for preparing the encapsulant material, the pressure is between 0.15 megapascal, the temperature is 100° C., and the heating time is 10 seconds;
other technical solutions in Example 3 are the same as that in Example 1.

Example 4

In this example, the encapsulant structure of a photovoltaic module comprises the following components:
45 parts by weight of fiber cloth; the fiber cloth is made of fiber material in the form of rib weave;
the weight per unit area of the fiber cloth is 80 g/m$^2$;
the monofilament diameter of the fiber material is 10 μm;
55 parts by weight of acrylic powder coating; the acrylic powder coating comprising an acrylic resin, a curing agent and an additive;
the curing agent is sebacic acid, which accounts for 22 wt. % of the acrylic powder coating;
the additive is amide modified phenolic urea surfactant, which accounts for 10 wt. % of the acrylic powder coating;
the weight per unit area of the acrylic powder coating on the fiber cloth is 250 g/m$^2$;
during the thermal bonding for preparing the encapsulant material, the pressure is between 0.18 megapascal, the temperature is 115° C., and the heating time is 8 seconds;
other technical solutions in Example 4 are the same as that in Example 1.

Example 5

In this example, the encapsulant structure of a photovoltaic module comprises the following components:
50 parts by weight of fiber cloth; the fiber cloth is made of fiber material in the form of mat weave;
the weight per unit area of the fiber cloth is 120 g/m$^2$;
the monofilament diameter of the fiber material is 13 μm;
50 parts by weight of acrylic powder coating; the acrylic powder coating comprising an acrylic resin, a curing agent and an additive;
the curing agent is undecandioic acid, which accounts for 25 wt. % of the acrylic powder coating;
the additive is benzoin, which accounts for 35 wt. % of the acrylic powder coating;
the weight per unit area of the acrylic powder coating on the fiber cloth is 300 g/m$^2$;
during the thermal bonding for preparing the encapsulant material, the pressure is between 0.2 megapascal, the temperature is 118° C., and the heating time is 6 seconds;
other technical solutions in Example 5 are the same as that in Example 1.

Example 6

In this example, the encapsulant structure of a photovoltaic module comprises the following components:
38 parts by weight of fiber cloth; the fiber cloth is made of fiber material in the form of hybrid of plain weave and twill weave;
the weight per unit area of the fiber cloth is 150 g/m$^2$;
the monofilament diameter of the fiber material is 16 μm;
62 parts by weight of acrylic powder coating; the acrylic powder coating comprising an acrylic resin, a curing agent and an additive;
the curing agent is dodecanedioic acid, which accounts for 16 wt. % of the acrylic powder coating;
the additive is poly(dimethylsiloxane), which accounts for 50 wt. % of the acrylic powder coating;
the weight per unit area of the acrylic powder coating on the fiber cloth is 350 g/m$^2$;
during the thermal bonding for preparing the encapsulant material, the pressure is between 0.25 megapascal, the temperature is 95° C., and the heating time is 15 seconds;
other technical solutions in Example 6 are the same as that in Example 1.

Example 7

In this example, the encapsulant structure of a photovoltaic module comprises the following components:
33 parts by weight of fiber cloth; the fiber cloth is made of fiber material in the form of hybrid of plain weave and satin weave;
the weight per unit area of the fiber cloth is 180 g/m$^2$;
the monofilament diameter of the fiber material is 18 μm;
67 parts by weight of acrylic powder coating; the acrylic powder coating comprising an acrylic resin, a curing agent and an additive;
the acrylic resin is hydroxy acrylic resin;
the curing agent is tridecanedioic acid, which accounts for 18 wt. % of the acrylic powder coating;
the additive is silica, which accounts for 45 wt. % of the acrylic powder coating;

the weight per unit area of the acrylic powder coating on the fiber cloth is 400 g/m²;

during the thermal bonding for preparing the encapsulant material, the pressure is between 0.22 megapascal, the temperature is 105° C., and the heating time is 20 seconds;

other technical solutions in Example 7 are the same as that in Example 1.

Example 8

In this example, the encapsulant structure of a photovoltaic module comprises the following components:

42 parts by weight of fiber cloth; the fiber cloth is made of fiber material in the form of hybrid of plain weave and satin weave;

the weight per unit area of the fiber cloth is 200 g/m²;

the monofilament diameter of the fiber material is 18 μm;

58 parts by weight of acrylic powder coating; the acrylic powder coating comprising an acrylic resin, a curing agent and an additive;

the acrylic resin is bifunctional acrylic resin;

the curing agent is tetradecandioic acid, which accounts for 20 wt. % of the acrylic powder coating;

the additive is hindered phenol, which accounts for 10 wt. % of the acrylic powder coating;

during the thermal bonding for preparing the encapsulant material, the pressure is between 0.16 megapascal, the temperature is 98° C., and the heating time is 18 seconds;

other technical solutions in Example 8 are the same as that in Example 1.

Example 9

In this example, the encapsulant structure of a photovoltaic module comprises the following components:

48 parts by weight of fiber cloth; the fiber cloth is made of fiber material in the form of hybrid of satin weave and rib weave;

the weight per unit area of the fiber cloth is 250 g/m²;

the fiber material is carbon fiber;

the monofilament diameter of the fiber material is 20 μm;

52 parts by weight of acrylic powder coating; the acrylic powder coating comprising an acrylic resin, a curing agent and an additive;

the curing agent is pentadecandioic acid, which accounts for 22 wt. % of the acrylic powder coating;

the additive is a mixture of acrylics, phenolic resin, and urea-formaldehyde resin, which accounts for 38 wt. % of the acrylic powder coating;

during the thermal bonding for preparing the encapsulant material, the pressure is between 0.18 megapascal, the temperature is 100° C., and the heating time is 16 seconds;

other technical solutions in Example 9 are the same as that in Example 1.

Example 10

In this example, the encapsulant structure of a photovoltaic module comprises the following components:

46 parts by weight of fiber cloth; the fiber cloth is made of fiber material in the form of hybrid of plain weave, twill weave, and mat weave;

the weight per unit area of the fiber cloth is 300 g/m²;

the fiber material is a mixture of glass fiber and aramid fiber;

the monofilament diameter of the fiber material is 23 μm;

54 parts by weight of acrylic powder coating; the acrylic powder coating comprising an acrylic resin, a curing agent and an additive;

the acrylic resin is a mixture of hydroxy acrylic resin and glycidyl methacrylate-type (GMA-type) acrylic resin;

the curing agent is a mixture of pentadecandioic acid and hexadecandioic acid, which accounts for 25 wt. % of the acrylic powder coating;

the additive is a mixture of melamine formaldehyde resin and distearoyl ethylenediamine, which accounts for 15 wt. % of the acrylic powder coating;

other technical solutions in Example 10 are the same as that in Example 1.

Example 11

In this example, the encapsulant structure of a photovoltaic module comprises the following components:

36 parts by weight of fiber cloth; the fiber cloth is made of fiber material in the form of hybrid of plain weave, twill weave, and mat weave;

the weight per unit area of the fiber cloth is 350 g/m²;

the fiber material is a mixture of glass fiber and carbon fiber;

the monofilament diameter of the fiber material is 14 μm;

64 parts by weight of acrylic powder coating; the acrylic powder coating comprising an acrylic resin, a curing agent and an additive;

the acrylic resin is hydroxy acrylic resin;

the curing agent is carboxyl polyester, which accounts for 18 wt. % of the acrylic powder coating;

the additive is a mixture of ethylene oxide and propylene oxide, which accounts for 10 wt. % of the acrylic powder coating;

other technical solutions in Example 11 are the same as that in Example 1.

Example 12

In this example, the encapsulant structure of a photovoltaic module comprises the following components:

35 parts by weight of fiber cloth; the fiber cloth is made of fiber material in the form of hybrid of plain weave, twill weave, and mat weave;

the weight per unit area of the fiber cloth is 400 g/m²;

the monofilament diameter of the fiber material is 23 μm;

65 parts by weight of acrylic powder coating; the acrylic powder coating comprising an acrylic resin, a curing agent and an additive;

the additive is a mixture of hindered phenol, thiodipropionate, diphenyl ketone, salicylate derivatives, hindered amine, alumina, and fumed silica, which accounts for 10 wt. % of the acrylic powder coating;

other technical solutions in Example 12 are the same as that in Example 1.

Example 13

In this example, the technical solutions are the same as that in Example 1 except that, in this example, the weight per unit area of the fiber cloth is 130 g/m²; and the weight per unit area of the acrylic powder coating on the fiber cloth is 180 g/m².

Example 14

In this example, the technical solutions are the same as that in Example 2 except that, in this example, the weight per unit area of the fiber cloth is 80 g/m²; and the weight per unit area of the acrylic powder coating on the fiber cloth is 280 g/m².

Comparison Example 1

Figure 5:
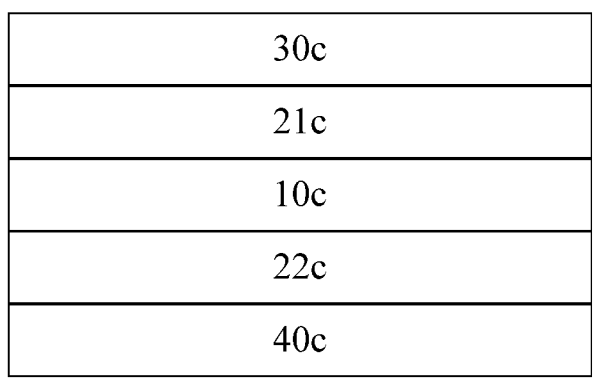
FIG. 5 is a schematic diagram of an encapsulant structure of a photovoltaic module in the prior art.

The encapsulant material in this example is shown in FIG. 5 as described in the background.

Comparison Example 2

The encapsulant material in this example employs an ethylene-vinyl acetate (EVA) copolymer adhesive film as described in the background.

Comparison Example 3

The encapsulant material in this example employs poly (octene-ethylene) (POE) adhesive film as described in the background.

Comparison Example 4

In this example, the technical solutions are the same as that in Example 1 except that, in this example, the encapsulant material comprises 30 parts by weight of fiber cloth and commercial epoxy powder coatings.

The comparisons of the implementation effect of the encapsulant materials in the examples and the comparison examples of the disclosure are listed in Table 1:

TABLE 1

Comparisons of implementation effect of the encapsulant materials in the examples and the comparison examples of the disclosure

| Test items | Weight of encapsulant structure | Impact resistance | | |
|---|---|---|---|---|
| | | Appearance | Maximum power degradation | Insulation resistance |
| Example 1 | ≤1 kg/m², easy to install | No defects | ≤5% | ≥40 MΩ · m² |
| Example 2 | ≤1 kg/m², easy to install | No defects | ≤5% | ≥40 MΩ · m² |
| Example 3 | ≤1 kg/m², easy to install | No defects | ≤5% | ≥40 MΩ · m² |
| Example 4 | ≤1 kg/m², easy to install | No defects | ≤5% | ≥40 MΩ · m² |
| Example 5 | ≤1 kg/m², easy to install | No defects | ≤5% | ≥40 MΩ · m² |
| Example 6 | ≤1 kg/m², easy to install | No defects | ≤5% | ≥40 MΩ · m² |
| Example 7 | ≤1 kg/m², easy to install | No defects | ≤5% | ≥40 MΩ · m² |
| Example 8 | ≤1 kg/m², easy to install | No defects | ≤5% | ≥40 MΩ · m² |
| Example 9 | ≤1 kg/m², easy to install | No defects | ≤5% | ≥40 MΩ · m² |
| Example 10 | ≤1 kg/m², easy to install | No defects | ≤5% | ≥40 MΩ · m² |
| Example 11 | ≤1 kg/m², easy to install | No defects | ≤5% | ≥40 MΩ · m² |
| Example 12 | ≤1 kg/m², easy to install | No defects | ≤5% | ≥40 MΩ · m² |
| Example 13 | ≤1 kg/m², easy to install | No defects | ≤5% | ≥40 MΩ · m² |
| Example 14 | ≤1 kg/m², easy to install | No defects | ≤5% | ≥40 MΩ · m² |
| Comparison example 1 | ≥8 kg/m², difficult to install | No defects | ≤5% | ≥40 MΩ · m² |
| Comparison example 2 | ≤1 kg/m², easy to install | No defects | >5% | <40 MΩ · m² |
| Comparison example 3 | ≤1 kg/m², easy to install | No defects | >5% | <40 MΩ · m² |
| Comparison example 4 | ≤1 kg/m², easy to install | No defects | ≤5% | ≥40 MΩ · m² |

| Test items | Fire resistance | Pencil hardness | Tensile strength | Elongation at break | Weathering test |
|---|---|---|---|---|---|
| Example 1 | Self-extinguishing, non-combustion | 1H satisfied | 25-35 megapascal | 150-250% | Successful |
| Example 2 | Self-extinguishing, non-combustion | 1H satisfied | 25-35 megapascal | 150-250% | Successful |
| Example 3 | Self-extinguishing, non-combustion | 1H satisfied | 25-35 megapascal | 150-250% | Successful |
| Example 4 | Self-extinguishing, non-combustion | 1H satisfied | 25-35 megapascal | 150-250% | Successful |
| Example 5 | Self-extinguishing, non-combustion | 1H satisfied | 25-35 megapascal | 150-250% | Successful |
| Example 6 | Self-extinguishing, non-combustion | 1H satisfied | 25-35 megapascal | 150-250% | Successful |
| Example 7 | Self-extinguishing, non-combustion | 1H satisfied | 25-35 megapascal | 150-250% | Successful |
| Example 8 | Self-extinguishing, non-combustion | 1H satisfied | 25-35 megapascal | 150-250% | Successful |
| Example 9 | Self-extinguishing, non-combustion | 1H satisfied | 25-35 megapascal | 150-250% | Successful |
| Example 10 | Self-extinguishing, non-combustion | 1H satisfied | 25-35 megapascal | 150-250% | Successful |
| Example 11 | Self-extinguishing, non-combustion | 1H satisfied | 25-35 megapascal | 150-250% | Successful |
| Example 12 | Self-extinguishing, non-combustion | 1H satisfied | 25-35 megapascal | 150-250% | Successful |
| Example 13 | Self-extinguishing, non-combustion | 1H satisfied | 25-35 megapascal | 150-250% | Successful |
| Example 14 | Self-extinguishing, non-combustion | 1H satisfied | 25-35 megapascal | 150-250% | Successful |
| Comparison example 1 | Self-extinguishing, non-combustion | 1H satisfied | 42 megapascal | 2-3% | Successful |
| Comparison example 2 | Combustible | 1H, unsatisfied | 16 megapascal | 550% | Successful |
| Comparison example 3 | Combustible | 1H, unsatisfied | 18 megapascal | 350% | Successful |
| Comparison example 4 | Self-extinguishing, non-combustion | 1H satisfied | 80-90 megapascal | 50-70% | Failed |

The weight of the encapsulant structure in the disclosure refers to the weight per unit square meter of the encapsulant material of the PV module. The impact resistance test is implemented as follows: an ice hockey with the standard diameter of 25 mm and the mass of 7.53 g is launched at the speed of 23.0 m/s to impact eleven positions of the packaged photovoltaic module, and then the impact resistance of the photovoltaic module is judged by the appearance, the maximum power degradation and the insulation resistance. The fire resistance is measured according to the UL1703 standard. The pencil hardness is measured according to the ASTM D3363-2005 (R2011) standard. The tensile strength is measured according to the GB/T 1040.3-2006 standard. The elongation at break is measured according to the GB/T 1040.3-2006 standard.

Based on the test data in Table 1, the encapsulant material meets the technical standards of the photovoltaic industry such as UV resistance, anti-aging, impact resistance, fire prevention and the like, and is inexpensive, light-weighted, can replace the tempered glass of conventional encapsulant structure, and provide rigidity for the photovoltaic module to protect the photovoltaic cells. Thus, the weight of the photovoltaic module is greatly reduced, which facilitates the installation of the photovoltaic module in different occasions, reduces the labor intensity for installing the photovoltaic module, improves the convenience of installation, and reduces the installation cost of the photovoltaic module.

In addition, the preparation method of the encapsulant material comprises uniformly coating the acrylic powder coating on the fiber cloth, thermally bonding the acrylic powder coating and the fiber cloth using pressure and heat, and then piecewise cutting the thermally bonded acrylic powder coating and the fiber cloth, to yield the encapsulant material. The dimensions of the PV module can be changed arbitrarily to meet the installation requirements of different buildings, which further facilitates the installation and application of the PV module.

Although the encapsulant material taught in this disclosure can be applied to the encapsulant of the photovoltaic modules with excellent implementation effect, the photovoltaic field is not the only application field of the material. One of ordinary in the art should apply the encapsulant material to other suitable fields, according to the actual needs and the characteristics and the actual performance of the encapsulant material of the disclosure, which involves no creative work and still belongs to the spirit of the disclosure, so such an application is also considered to be as the scope of the protection of the rights of the disclosure.

Unless otherwise indicated, the numerical ranges involved include the beginning and end values. It will be obvious to those skilled in the art that changes and modifications may be made, and therefore, the aim in the appended claims is to cover all such changes and modifications.

What is claimed is:

1. An encapsulant material for a photovoltaic module, the encapsulant material comprising:
   between 30 and 50 parts by weight of fiber cloth, the fiber cloth being made of a fiber material; and
   between 50 and 70 parts by weight of acrylic powder coating, the acrylic powder coating comprising an acrylic resin, a curing agent, and an additive;
   wherein:
   the acrylic powder coating is uniformly coated on the fiber cloth;
   the curing agent is present in an amount of between 5 and 25% by weight of the acrylic powder coating, and is selected from the group consisting of blocked isocyanate, phthalic anhydride, trimellitic anhydride, sebacic acid, undecanedioic acid, dodecanedioic acid, tridecanedioic acid, tetradecanedioic acid, pentadecanedioic acid, hexadecanedioic acid, carboxyl polyester, hydrogenated epoxy, glycidyl methacrylate-type (GMA-type) acrylic acid, and a mixture thereof; and
   the fiber material is glass fiber, carbon fiber, aramid fiber, or a mixture thereof.

2. The encapsulant material of claim 1, wherein a weight per unit area of the fiber cloth is between 30 and 400 g/m$^2$, and a weight per unit area of the acrylic powder coating on the fiber cloth is between 100 and 400 g/m$^2$.

3. The encapsulant material of claim 1, wherein a monofilament diameter of the fiber material is between 3 and 23 μm.

4. The encapsulant material of claim 1, wherein the fiber cloth is made of fiber material in the form of plain weave, twill weave, satin weave, rib weave, mat weave, or a combination thereof.

5. The encapsulant material of claim 1, wherein the additive is present in an amount of between 10 and 50% by weight of the acrylic powder coating, and the additive is polyamide wax, polyolefine wax, amide modified phenolic urea surfactant, benzoin, poly(dimethylsiloxane), vinyl trichlorosilane, n-butyl triethoxyl silane, tetramethoxysilane (TMOS), monoalkoxy pyrophosphate, acrylics, phenolic resin, urea-formaldehyde resin, melamine formaldehyde resin, distearoyl ethylenediamine, a mixture of ethylene oxide and propylene oxide, hindered phenol, thiodipropionate, diphenyl ketone, salicylate derivatives, hindered amine, alumina, fumed silica, silica, or a mixture thereof.

6. The encapsulant material of claim 1, wherein the acrylic powder coating has a particle size of between 35 and 300 μm.

7. An encapsulant material for a photovoltaic module, the encapsulant material comprising:
   between 30 and 50 parts by weight of fiber cloth; and
   between 50 and 70 parts by weight of acrylic powder coating, the acrylic powder coating comprising an acrylic resin, a curing agent, and an additive;
   wherein:
   the acrylic powder coating is uniformly coated on the fiber cloth;
   the curing agent is present in an amount of between 5 and 25% by weight of the acrylic powder coating, and is selected from the group consisting of blocked isocyanate, phthalic anhydride, trimellitic anhydride, sebacic acid, undecanedioic acid, dodecanedioic acid, tridecanedioic acid, tetradecanedioic acid, pentadecanedioic acid, hexadecanedioic acid, carboxyl polyester, hydrogenated epoxy, glycidyl methacrylate-type (GMA-type) acrylic acid, and a mixture thereof; and
   a weight per unit area of the fiber cloth is between 30 and 400 g/m$^2$, and a weight per unit area of the acrylic powder coating on the fiber cloth is between 100 and 400 g/m$^2$.

* * * * *